United States Patent [19]
Shmookler et al.

[11] Patent Number: 5,483,138
[45] Date of Patent: Jan. 9, 1996

[54] SYSTEM AND METHOD FOR AUTOMATED POSITIONING OF A SUBSTRATE IN A PROCESSING CHAMBER

[75] Inventors: Simon Shmookler, San Francisco; Andrew G. Weinberg, San Jose; Martin J. McGrath, Sunnyvale, all of Calif.

[73] Assignee: Applied Materials, Inc., Santa Clara, Calif.

[21] Appl. No.: 249,095

[22] Filed: Apr. 21, 1994

Related U.S. Application Data

[63] Continuation of Ser. No. 975,197, Nov. 12, 1992, abandoned.

[51] Int. Cl.⁶ .................................................. G05B 11/01
[52] U.S. Cl. ......................................................... 318/568.16
[58] Field of Search .............................. 318/560, 568.16, 318/687, 568.19, 568.12

[56] References Cited

U.S. PATENT DOCUMENTS

| | | | |
|---|---|---|---|
| 4,819,167 | 4/1989 | Cheng et al. | 364/167.01 |
| 4,833,790 | 5/1989 | Spencer et al. | 33/520 |
| 4,871,955 | 10/1989 | Berger | 318/640 |
| 4,980,626 | 12/1990 | Hess et al. | 318/568.16 |
| 5,198,740 | 3/1993 | Jacobsen et al. | 318/687 |

FOREIGN PATENT DOCUMENTS

| | | | |
|---|---|---|---|
| 313466 | 4/1989 | European Pat. Off. | H01L 21/00 |
| 508748 | 10/1992 | European Pat. Off. | H01L 21/00 |
| 2180097 | 3/1987 | United Kingdom | H01L 21/68 |

*Primary Examiner*—William M. Shoop, Jr.
*Assistant Examiner*—Karen Masih
*Attorney, Agent, or Firm*—Birgit E. Morris

[57] ABSTRACT

An improved position control means for robotic handling systems; particularly, a system and method for determining the centerpoint of a moving object, such as a semiconductor wafer, and calibration of the object support, using an array of sensors positioned generally transverse to the arcuate path of movement of the object and its support to detect the relative positions of the object and the support to a selected destination point for the purpose of precisely positioning the object relative to the selected destination point.

18 Claims, 7 Drawing Sheets

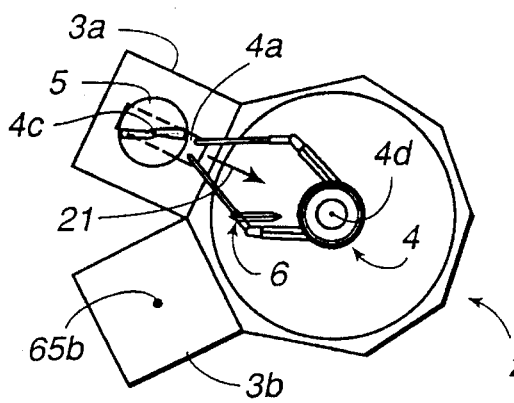
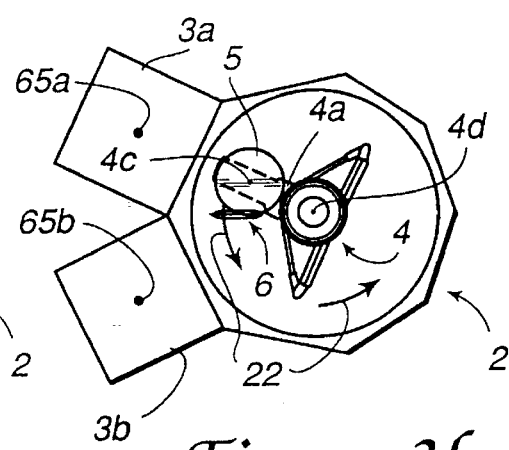
*Figure 3a*  *Figure 3b*
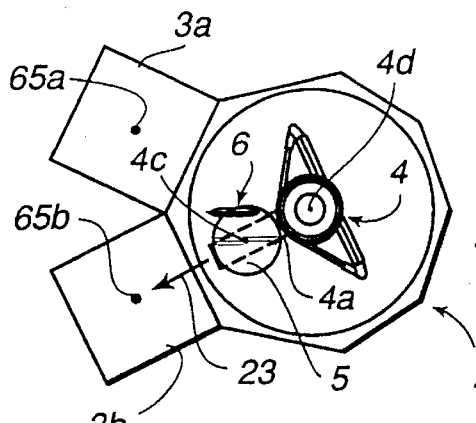
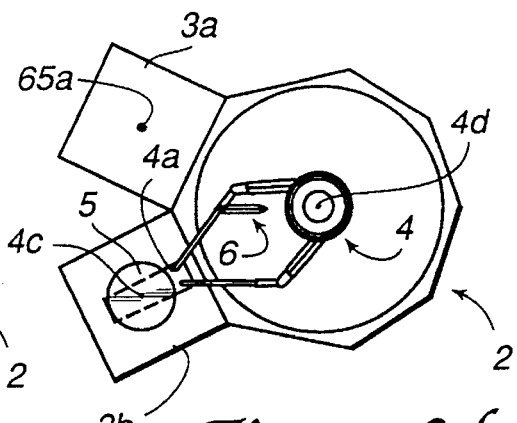
*Figure 3c*  *Figure 3d*
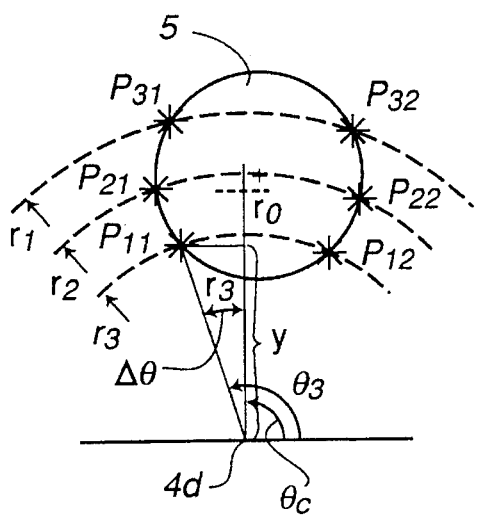
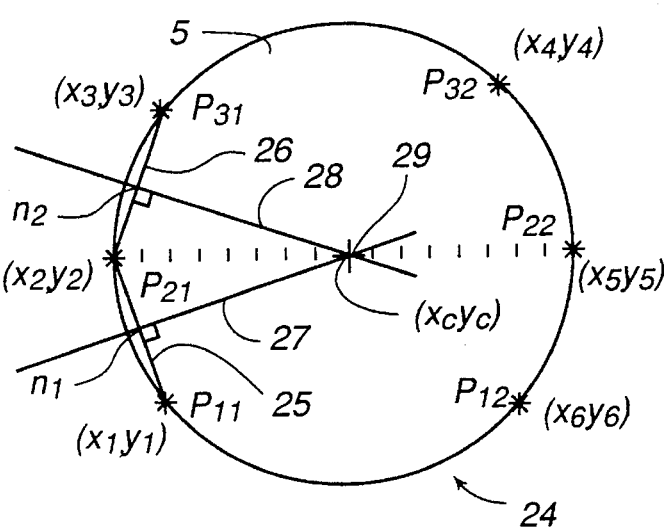
*Figure 4*  *Figure 5*

SYSTEM AND METHOD FOR AUTOMATED POSITIONING OF A SUBSTRATE IN A PROCESSING CHAMBER

This is a continuation of U.S. application Ser. No. 07/975,197 filed Nov. 12, 1992 and now abandoned.

BACKGROUND OF THE INVENTION

1. Field of the Invention

This invention relates generally to an improved position control means for robotic handling systems and more particularly, to an improved system and method for transferring a substrate to a predetermined position in a processing chamber.

2. Description of the Prior Art

In the manufacture of integrated circuits, semiconductor substrates are loaded into various reaction and other chambers using automated equipment for processing. Equipment has been designed including a robot that can transfer a semiconductor substrate, such as a silicon wafer, from a cassette through a central transfer chamber and into one or more processing chambers about and connected to the transfer chamber, in which the robot is located. It is desirable to know the exact location of the semiconductor substrate relative to the processing chamber so that the substrate can be precisely positioned at an optimum location within the processing chamber to maximize the effectiveness of the processing onto the precise desired surface area of the substrate to be processed. Likewise, it is also desirable that the substrate positioning apparatus that is used as a reference point and upon which the substrate is transported be routinely calibrated so that positioning error is minimized, if not eliminated.

Currently, there are few known different methods and systems for locating the centerpoint of semiconductor substrates; they include those disclosed in: Spencer et al, U.S. Pat. No. 4,833,790, entitled METHOD AND SYSTEM FOR LOCATING AND POSITIONING CIRCULAR WORKPIECES, issued May 30, 1989; and, Cheng et al, U.S. Pat. No. 4,819,167, entitled SYSTEM AND METHOD FOR DETECTING THE CENTER OF AN INTEGRATED CIRCUIT WAFER, issued Apr. 4, 1989, and which patent is commonly assigned to Applied Materials, Inc., of Santa Clara, California, the Assignee of the present invention.

In Spencer et al, the method and system disclosed is of a "spindle" type whereby a wafer is transferred by shuttle to a spindle where it is incrementally rotated, the distances between the center of rotation to the periphery of the wafer is measured along a linear path by a sensor means, the wafer centerpoint offset is calculated by geometric analysis of the measurements, and the wafer centered on the spindle by the shuttle.

There are several disadvantages with the Spence: spindle type method and system. First, it is an entirely separate and distinct apparatus from the processing system. Having a separate centerfinding apparatus requires an additional step in the manufacturing process, adding cost and complexity and decreasing valuable throughput time. That is, the wafer cannot be directly unloaded by robot from the wafer storage cassette and transferred to a processing chamber without first being manipulated by the separate centerfinding apparatus. As a result, the Spencer et al spindle type system and method does not take advantage of the direct movement of the wafer as it is transferred from the wafer storage cassette to the processing chamber. In addition, the Spencer et al system shuttle may require periodic calibration by a separate calibration tool if the centerfinding method is to remain accurate. Furthermore, once the positioning method has been performed, the wafer is transferred to a separate wafer transport arm which may also require periodic calibration to maintain precision positioning of the wafer.

In Cheng et al, the system and method disclosed is of an "optical sensor array" type whereby a semiconductor wafer is moved along a linear path across an array of sensors positioned generally transverse to the linear path of the wafer support blade. This centerfinder method is performed upon the direct removal of the wafer from a storage cassette by a processing system robot and while en route to a processing chamber. The robot blade and peripheral edges of the wafer are detected separately by the optical sensors to calculate the coordinate center position of the wafer relative to the robot blade. An xy coordinate system is defined by the path (x) of movement of the robot arm/blade and the center line (y) of the optical sensors. The origin (0) of the y coordinate axis is defined by the position of the center sensor. The detection of the robot blade provides a reference point and origin (0,0) of the xy coordinate system from which to move the wafer to its destination point. The detection of points along the leading and trailing edges of the wafer provide points on the x axis generally parallel to the path of movement of the wafer and from which the centerpoint of the wafer can be geometrically determined. Once the wafer center position is geometrically determined, the wafer can be moved and positioned at the destination location.

The Cheng et al type centerfinding system overcomes the disadvantages of the Spencer et al type system in that a separate and distinct apparatus is not required to determine the centerpoint of the wafer. The centerpoint of the wafer is determined directly during movement of the wafer to its destination location. This is especially advantageous in a wafer processing system configuration where there exists a robot of a R-Theta type in a multiple chamber processing apparatus with a single loadlock chamber as shown in Cheng et al.

However, there are disadvantages to the Cheng centerfinding system. The first and foremost disadvantage is that the wafer must pass over the sensors in a linear path transverse to the position of the sensors which are positioned adjacent to the loadlock chamber. This means that the centerfinding operation can only take place when a wafer is being loaded or unloaded from the loadlock chamber adjacent to the position of the sensors. This is a distinct disadvantage when the processing system has multiple loadlock as well as multiple processing chambers. Each time a wafer is transported from one chamber to another, it must first be transferred back to the loadlock chamber adjacent the sensors so that the wafer can be passed through the sensors in the linear fashion shown in Cheng et al for the centerfinding method to be performed. As a result, the Cheng et al centerfinder system is ill-suited to the multiple chamber wafer processing system configuration in that it causes a decrease in valuable throughput time. If multiple sensor arrays are used, for example, if a sensor array is positioned adjacent to each loadlock and processing chamber, the increase in complexity and cost would render the configuration impractical. Furthermore, the algorithms used to geometrically determine the centerpoint of the wafer cannot be easily extended to include more than three sensors.

The second disadvantage of the Cheng et al centerfinder system is that once the wafer centerpoint is determined, the positioning of the wafer is relative to a reference point taken from the robot blade. This is a disadvantage in that the reference point is previously calibrated relative to the position of a "golden" wafer, hand centered on the blade. This manual intervention for calibrating the robot blade increases the chance of calibration error. In addition, the golden wafer used may have an undetected defect, or not be perfectly round, thereby increasing calibration error. Lastly, manual intervention using a separate and distance calibration tool such as a golden wafer is cumbersome and inefficient.

A third disadvantage of the Cheng et al centerfinder is that the sensor electronics are disposed within the system transfer chamber. The sensor electronics must be placed within the transfer chamber to reduce sensor error in the detection of the wafer. Being thus disposed, the components of the electronics can outgas, thereby contaminating the wafers. This is a further reason why a plurality of sensor arrays are impractical with this type of centerfinder system. The greater the number of sensor arrays, the greater the likelihood of contamination.

An additional disadvantage of the Cheng et al centerfinder is that the robot arm must be in an extended position for the wafer to be detected by the sensors. The extended stroke of the robot increases any calibration error and reduces the accuracy of the centerfinder operation.

Thus, a need has arisen for an improved system and method for determining the location of a semiconductor substrate with respect to a semiconductor substrate support which increases throughput time in a multiple loadlock and processing chamber system, includes sensor electronics disposed outside the transfer chamber for reduction of contaminates, is easily extendable to accommodate a plurality of sensor arrays, and wherein the location operation occurs when the robot arm is in a retracted position to minimize calibration error, if any. In addition, there is a need for an improved positioning system which can be calibrated without manual intervention or need for a separate and distinct calibration tool.

SUMMARY OF THE INVENTION

In accordance with the present invention, there is first provided an improved position control system for precisely positioning an object, such as a semiconductor substrate, relative to a selected location ("destination location") of a processing system which comprises a central substrate transfer chamber, a plurality of peripheral processing and other chambers positioned around the periphery of the transfer chamber, and a transfer means disposed in the transfer chamber for loading, moving and unloading substrates to and from the peripheral chambers. The object transfer means includes an object support which is moved within the transfer chamber generally along an arcuate path between the peripheral chambers. Position control means are provided for detecting the position of the object relative to its support and for causing the transfer means to accurately position the object in one of the peripheral chambers.

The improved position control system includes an array of optical sensors positioned generally along a line substantially transverse to the arcuate path of movement of an object as it is carried between chambers by the robot support so that when the leading and trailing edges of the object (or a detectible attribute of the object support during calibration) pass by the sensors, the sensors are triggered to generate object detection signals (and support detection signals during calibration). During calibration, means responsive to the support detection signals determine the position of the support relative to a system reference which has a known relationship to any selected destination location. During object transfer, means responsive to the object detection signals determine the position of the object relative to the support, and move the support to a corresponding calculated offset position, thereby allowing the robot to accurately position the object at a preselected destination location.

There is also provided an improved method for determining the position of an object, such as a semiconductor wafer, relative to a movable wafer support, the object having a leading and a trailing edge and being positioned on the moveable support (typically a wafer support blade) for the purpose of moving the object from a pick-up point and along a path having an arcuate component to a selected destination location, such as within a processing chamber, the dynamic position of the support being known, comprising the steps of: providing a plurality of photoelectric sensors arranged at known points along a line generally transverse to the arcuate path; moving the object support along the arcuate path past the arrangement of sensors so that the sensors are triggered by the leading and trailing edges of the object causing relative output signals to be generated; calculating the centerpoint of the object from the generated output signals; and moving the object support to a desired position so that the object is placed at a preselected location, e.g., the center of a processing chamber.

There is also provided a method for calibrating the position of a moveable object support having a known width, such as a substrate support blade of a robot centrally disposed within a transfer chamber having a plurality of processing chambers positioned around the periphery thereof, the support blade being moveable along a generally arcuate path between the processing chambers, comprising the steps of: providing an array of sensors at predetermined locations within the transfer chamber for detecting the passage of the support blade thereby and for providing corresponding sensor signals, at least one of the sensors being mounted along an axis generally transverse to the arcuate path; determining the coordinate position of a selected sensor; and determining the coordinate position of the movable object support relative to the determined sensor position so that the relationship can be used for subsequent positioning of the support.

DESCRIPTION OF THE DRAWINGS

FIGS. 3a–3d are plan views of the transfer chamber shown in FIG. 1 illustrating the sequential movement of a robot and substrate from a first chamber to a second chamber and intersection of the sensor array to implement the substrate centerfinder aspect of the invention;

FIG. 4 is a diagrammatical depiction of the geometric relationship of the six sensor trigger points and the robot center of rotation reference point used in the determination of the coordinate locations of the substrate trigger points;

FIG. 5 is a diagrammatical depiction of the geometric relationship between three trigger points and the center of the substrate used in the determination of the centerpoint of the substrate;

DETAILED DESCRIPTION OF THE PREFERRED EMBODIMENT

1. Overview of The System Assembly

Although the following description describes the invention in terms of a semiconductor wafer, this is for illustration purposes only and other substrates or objects to be transferred to a preselected location can be substituted therefor, as will be known to one skilled in the art.

Figure 1:
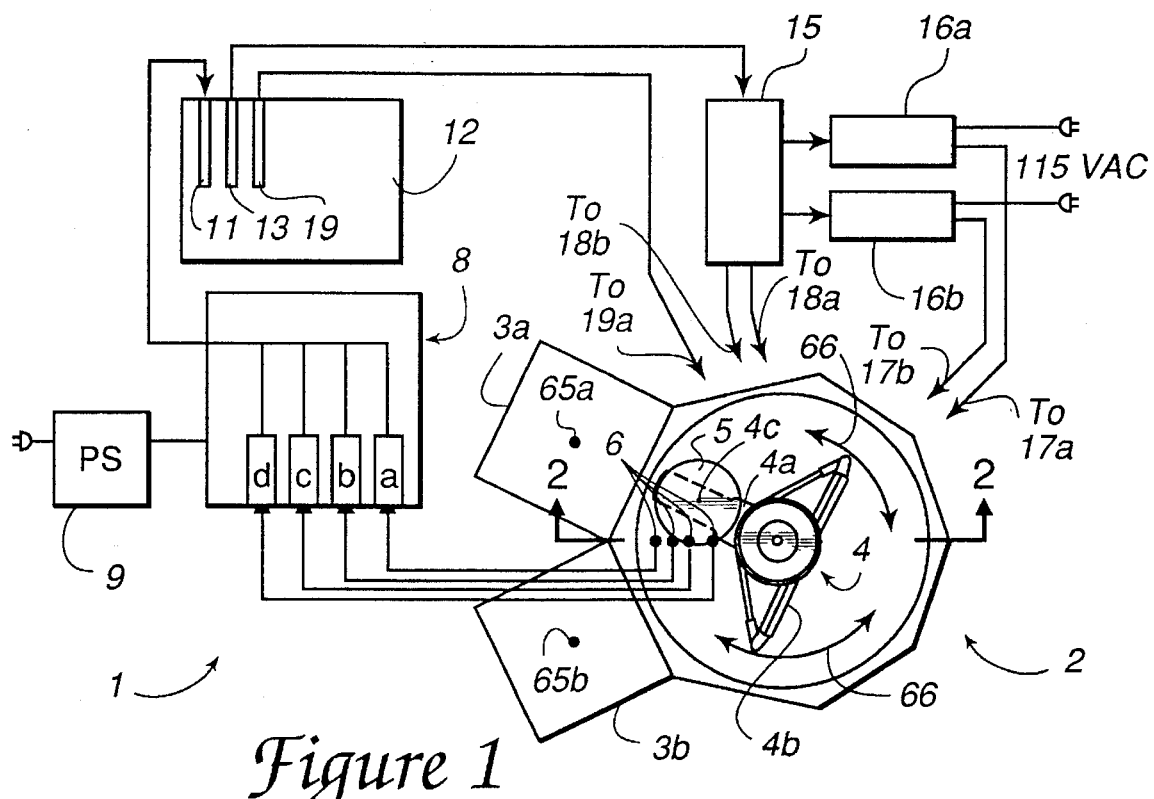
FIG. 1 is a schematic diagram of the system assembly of the invention.
Figure 2:
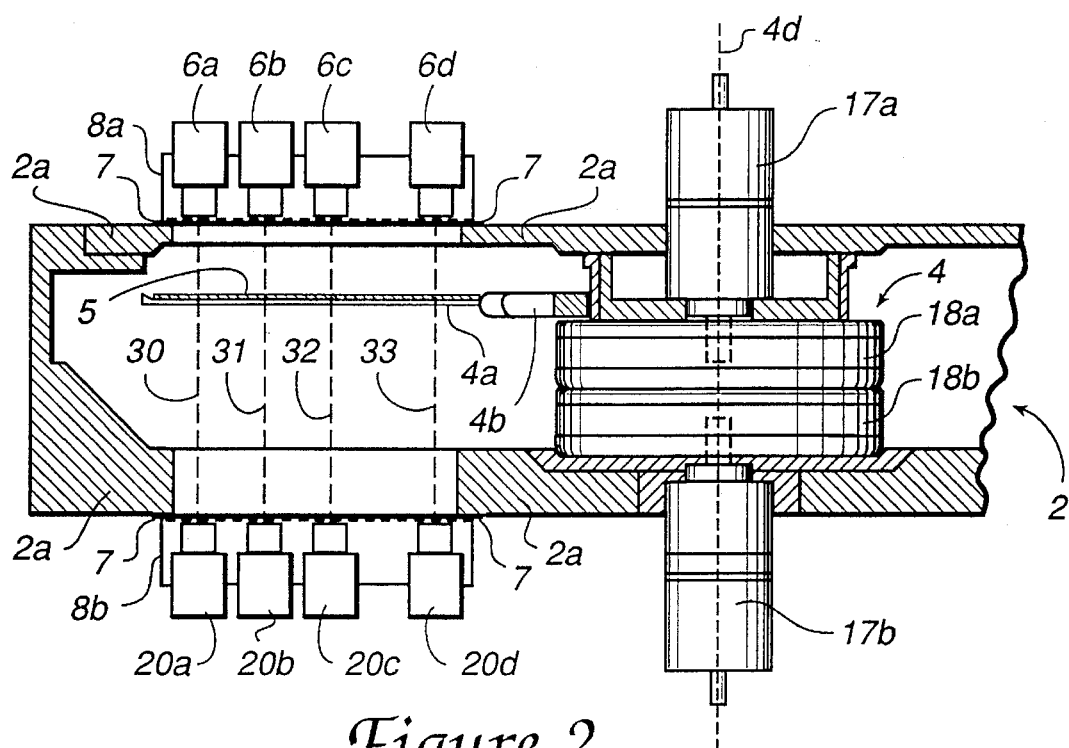
FIG. 2 is a cross-sectional view of a semiconductor processing transfer chamber taken along the line 2—2 of FIG. 1.

FIG. 1 of the accompanying drawing is a diagrammatic representation of a multi-chamber, semiconductor wafer processing system including a wafer robot centerfinding and calibration system and method in accordance with the present invention. The system shown generally at i includes a transfer chamber 2 having at least two integrally attached wafer receiving chambers 3a (e.g., a loadlock chamber) and 3b (e.g., a wafer processing chamber) having centrally located, optimal position points 65a and 65b respectively. During processing, the wafer should be centered over these positions 65a and 65b. A wafer transfer means such as the R-theta robot 4 having a wafer support blade 4a, is shown with a semiconductor wafer 5 in transfer position thereon. A photoelectric sensor array preferably including four sensors connected to a sensor electronics assembly 8 (shown separated by way of example from sensor array 6 for the convenience of component illustration) and having a power supply 9, the assembly 8 being connected to a sensor interface card 11 receivingly engaged within a processing means 12. The processing means also includes a robot motor control interface card 13 connected to a robot motor interface (terminal) board 15 having connected to it a motor driver 16a connected to a first robot motor 17a (FIG. 2), and a second motor driver 16b connected to a second robot motor 17b (FIG. 2). The terminal board 15 is also connected to robot motor encoders 18a and 18b. Processing means 12 also includes a digital input/output card 19 which is connected to a robot "home" sensor 19a (not shown).

Sensor array 6 is preferably positioned between a pair of chambers 3a and 3b such that the centerfinding method of this invention, more fully described hereinbelow, can be performed during normal wafer transfer operation. A four sensor array is preferred for increased redundancy and accuracy. Using a four sensor array is particularly advantageous when processing silicon wafers with multiple flats as the substrate. However, the centerfinding method can be performed with as few as two sensors.

While only a single array is shown for purposes of illustration of the invention, an alternative configuration can include multiple arrays respectively positioned between other chamber pairs. The mathematical algorithms used in the determination of the centerpoint of a wafer as disclosed herein are easily extendable by one skilled in the art to accommodate as many sensors and arrays as are desired.

Figure 7:
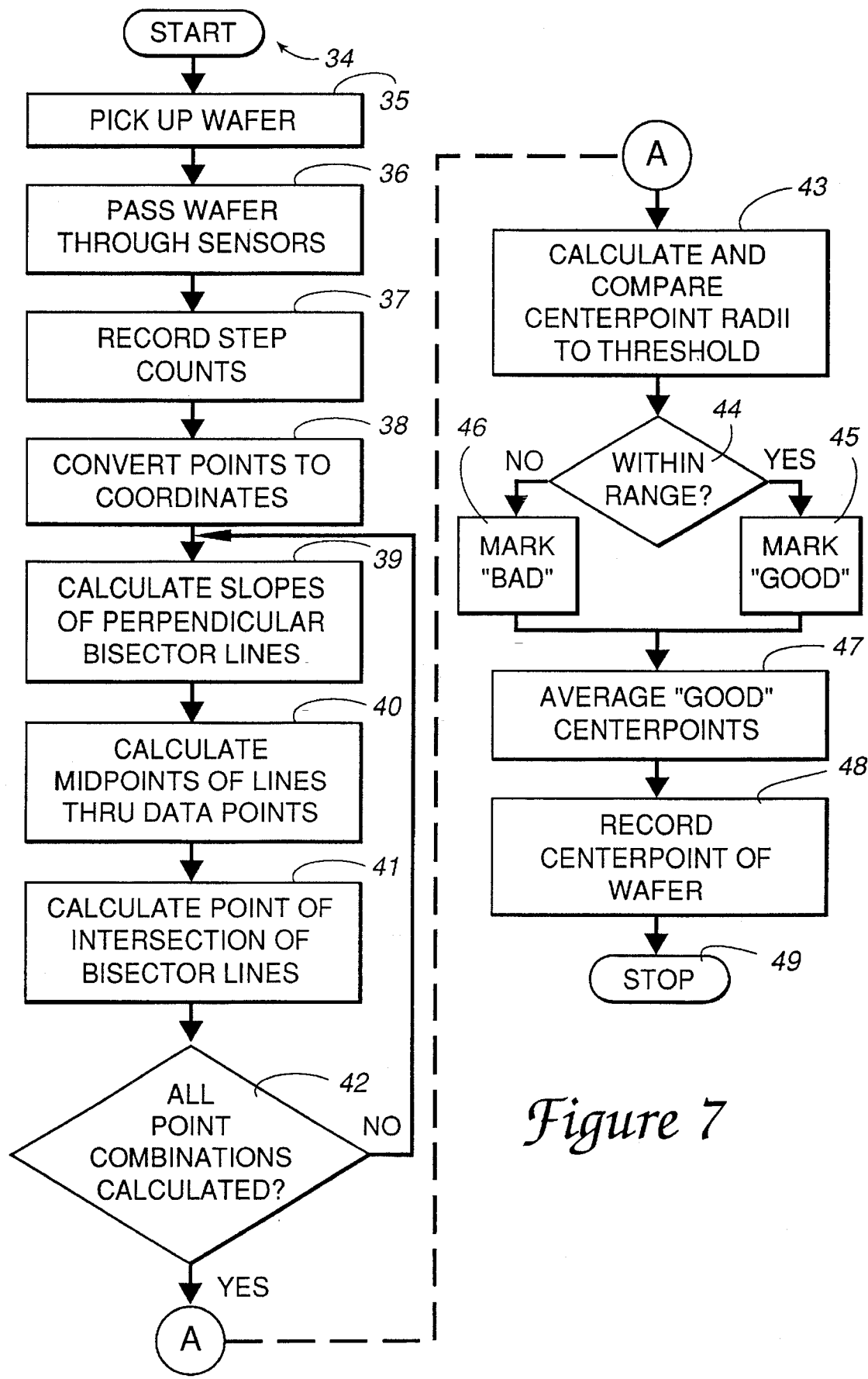
FIG. 7 is a flow chart of the computer program centerfinder routine used to perform the centerfinding method of this invention.
Figure 11:
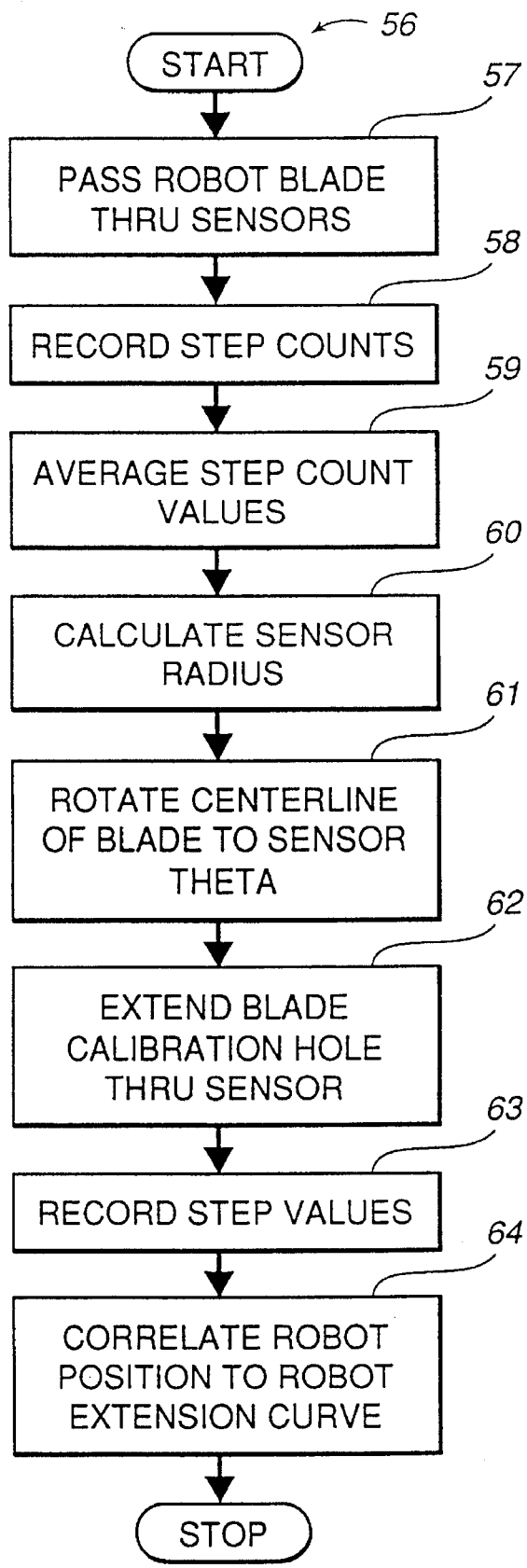
FIG. 11 is a computer program flow chart depicting the calibration routine of this invention.

By way of example, the system robot 4 may consist of an Applied Materials, Inc., 5500 or 5200 R-Theta robot; the photoelectric sensors of array 6 may consist of Banner Engineering, Inc., model nos. SM31RL and SM31-EL (pair); the sensor interface card 11 may consist of an IBM®/PC compatible sensor interface card; the processing means 12 may consist of an IBM® compatible personal computer; the motor control interface card 13 may consist of a Metrabyte counter/encoder board model no. 5312; and the digital input/output card 19 may consist of an Oregon Micro Systems stepper controller board model no. PCX-4E. A system assembly control computer program written in C language is used to control the centerfinding and calibration operations of the invention, the logic of which is shown in FIGS. 7 and 11 and described in greater detail hereinbelow.

FIG. 2 is a partial cross-sectional view of the transfer chamber 2 of FIG. 1 taken along the line 2—2. As shown, the chamber 2 includes the R-Theta robot 4 having dual stepper motors 17a (upper) and 17b (lower) with integral motor encoders 18a and 18b, a wafer support blade 4a and robot arms 4b. Also shown in FIG. 2 is a photoelectric sensor array 6 comprising four receivers 6a, 6b, 6c and 6d and four emitters 20a, 20b, 20c and 20d, and associated electronics shown generally at 8a and 8b. As was illustrated in FIG. 1, the array of sensor emitter-receiver pairs is positioned to extend along a line transverse to the arcuate path 66 followed by the wafer 5 as it is moved between chambers. Emitters 20a–d and receivers 6a–d are disposed outside of the transfer chamber 2 to eliminate contamination as a result of any outgasing associated with the sensor electronics. The sensing light beams 30–33 pass into and out of the transfer chamber 2 through quartz windows 7 disposed in the upper and lower walls 2a.

2. Overview of The Centerfinding Method

FIGS. 3a–3d illustrate the sequential movement of the system robot 4 and the wafer 5 from a first chamber 3a to a second chamber 3b while intersecting the sensor array 6 for the performance of the wafer centerfinding aspect of the invention.

Referring now to FIG. 3a, the robot 4 is shown in its fully extended position for retrieval of a wafer 5 from a chamber 3a. Once the wafer 5 is loaded onto the support blade 4a, the robot 4 retracts the support blade 4a and carries the wafer 5 from the first chamber 3a moving radially in the direction of arrow 21 to its fully retracted position as shown in FIG. 3b. Once retracted, the robot 4 rotates about its axis 4d in the direction of the arrow 22 causing the support blade 4a and the wafer 5 to sweep in an arcuate path across the sensor array 6 while en route to the second chamber 3b. FIG. 3c shows the position of the robot 4, the support blade 4a and the wafer 5 subsequent to the movement across the sensor array 6, and prior to radial extension into the second chamber 3b.

The movement of the wafer 5 across the sensor array 6 permits the detection of coordinate points along the leading and trailing edges of the wafer 5 so that the centerpoint of the wafer 5 can be geometrically determined in relation to the known position of the center 4c of the support blade 4a. The method of centerpoint determination is more fully described hereinbelow with reference to FIGS. 5 and 6.

Once the centerpoint of the wafer 5 is determined with relation to the center reference point 4c of the support blade 4a (i.e., point 4c is a point on support blade 4a concentric with the center point of a wafer 5 properly centered thereon), any position error is known. Thus the support blade 4a can be rotated as necessary and extended in the direction of the arrow 23 for precise placement of the center of the wafer 5 in the second chamber 3b so that the centerpoint of the wafer 5 is coincident with the selected destination location Precision placement of the wafer 5 in the second chamber (FIG. 3d) is accomplished by moving the center of the support blade 4a into a position so that its center point 4c is offset from location 65b by an equal and opposite distance to any position error found for the wafer 5 on the support blade 4a. The wafer center will thereby be precisely placed at the preselected location 65b in the second chamber 3b. By way of example, if the center of the wafer is determined to be located at coordinate B+X,B+Y in relation to the centerpoint B of the support blade, the center P of the support blade 4a will be positioned in the second chamber 3b at coordinates C-X,C-Y in relation to the selected chamber point C, so that the center of the wafer 5 will be aligned with the preselected location 65b.

a. Determination of The Wafer Centerpoint

In FIGS. 4 and 5 there are shown six trigger points P11, P12, P21, P22, P31 and P32 as determined by the corresponding output signals of an array of three pairs of sensor emitters-receivers. (While a four pair array is preferred as previously disclosed above for ease of description and illustration herein, an exemplary array of three emitter-receiver pairs is discussed). The method of determining the relative coordinates of the trigger points during rotation of the robot 4 is to use a single interrupt to the main system controller microprocessor 12.

Referring now to FIGS. 2 and 6, the relative coordinates of the trigger points are first determined as a change in state of the sensors 6a–d and 20a–d. As the wafer 5 passes through each beam 30, 31, 32 and 33, a change of state occurs for each pair of emitters-receivers 6a–20a, 6b–20b, 6c–20c and 6d–20d, first at the leading edge of the wafer 5 and then at the trailing edge.

Figure 6A:
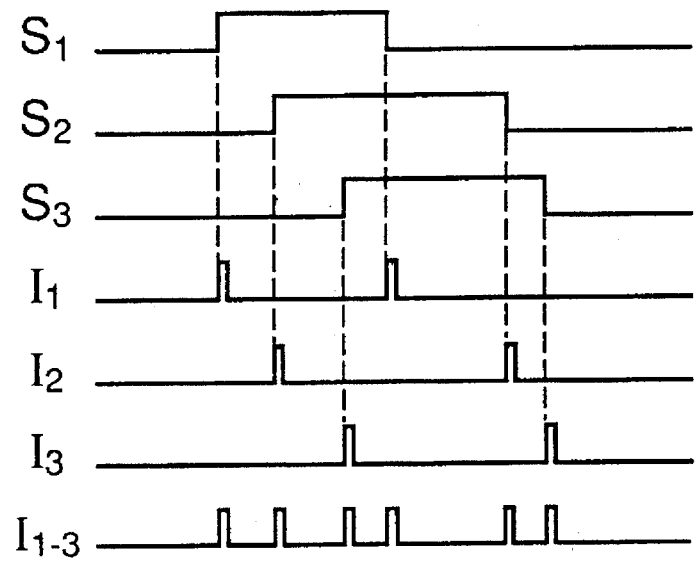
FIG. 6a is a diagram representing wave forms of the change in states of the photoelectric sensors and corresponding individual and combined interrupt signals.
Figure 6B:
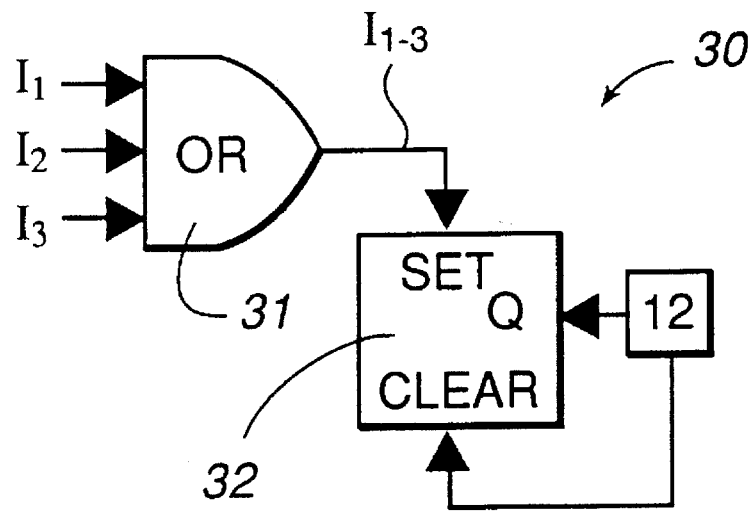
FIG. 6b is a simplified circuit diagram for the ordered processing of sensor signals.

FIG. 6a is a graphical representation of the occurrence of the change of states of a three sensor array. As shown, the first three rows depict the changes of state of the sensor signals S1, S2 and S3, first at the leading edge of a wafer and second at the trailing edge. The signal forms S1, S2 and S3 depict, by way of example, the output signals corresponding to receivers 6a, 6c, and 6d of FIG. 2. The second three rows depict the corresponding interrupt pulses I1, I2 and I3 generated at the leading and trailing edges of the signals S1–S3. The last row depicts a single pulse chain or interrupt line I1-3 showing the interrupt pulses for all six trigger points on the wafer 5.

The change of state of each sensor is detected by a circuit 30 (FIG. 6b) of the digital sensor interface card 11 (FIG. 1). At each change of state, the circuit 30 generates a pulse (I1, I2 or I3) which is directed through an "or" gate 31 which in turn sets an interrupt flip-flop 32 on the processing means (microprocessor) 12 (FIG. 1). When the flip-flop 32 receives the first pulse of pulse chain I1-3, Q is set to high (0 to 1) and a standard microprocessor interrupt service routine is executed to get the associated trigger point data and motor 17a–b step counts (present theta and R locations of stepper motors at detection). Once the data is retrieved and recorded, the microprocessor 12 resets the flip-flop (1 to 0) readying it to receive another pulse in chain I1-3. An input table is created and stored in memory corresponding to the digital representation of the changes of state of sensor signals S1, S2 and S3, and the theta angle measurement of each in terms of steps of the robot stepper motors 17a and 17b (FIG. 2). By way of example, the interrupt input table might look substantially as follows:

TABLE I

| Table Index # | S1 | S2 | S3 | Theta (in steps) |
|---|---|---|---|---|
| 0 | 0 | 0 | 0 | — |
| 1 | 1 | 0 | 0 | 15,000 |
| 2 | 1 | 1 | 0 | 17,500 |
| 3 | 1 | 1 | 1 | 20,400 |
| 4 | 0 | 1 | 1 | 25,200 |
| 5 | 0 | 1 | 0 | 27,510 |
| 6 | 0 | 0 | 0 | 29,330 |

The interrupt processing routine need not indicate which sensor caused the interrupt, and only needs to save the signal data from the sensors. From the input table data, the polar coordinates of the six trigger points P11, P12, P21, P22, P31 and P32 can be determined relative to the known center 4d of rotation of the robot 4.

Referring now to FIG. 4, the center of the support blade 4a is at polar coordinate ($r_o$, $\theta_c$), where $r_o$ is the calibrated radial distance from the center of robot rotation point 4b and $\theta_c$ is the angular position of the support blade 4a about the robot center of rotation 4b. The radii r1, r2 and r3 of each of the trigger points P11, P12, P21, P22, P31 and P32 are known as they are the same radii as the sensor locations which are determined as a function of the robot calibration method described herein below. By determining the difference in angle $\Delta\theta$ in degrees as a function of motor steps from a known home position of the robot 4 to a trigger point position (Table I), the polar coordinates ($r,\theta$) can be determined.

Once the polar coordinates of the six trigger points P11, P12, P21, P22, P31 and P32 are determined, they are converted to cartesian coordinates (X,Y) relative to the known center of rotation of the robot which is the selected origin point (0,0) of the coordinate system. By knowing at least three points on the circumference of the wafer 5, as depicted in FIG. 5, the centerpoint can be geometrically calculated. A line can be drawn from any two points on a circle. A line which passes through the midpoint of that line at a right angle passes through the center of the circle. Therefore, the coordinate point of intersection of two lines which bisect at right angles the midpoints of two lines passing through any two trigger points on the circumference of the wafer 5 is the centerpoint.

By way of illustration, FIG. 5 shows trigger points P11, P21, and P31 having corresponding cartesian coordinates (X1,Y1), (X2,Y2) and (X3,Y3) on the circumference of the wafer 5. If lines 25 and 26 are drawn connecting points (X1,Y1) with (X2,Y2) and (X2,Y2) with (X3,Y3), lines 27 and 28 drawn perpendicular to the midpoint of lines 25 and 26 will intersect at the coordinate centerpoint 29 of the wafer 5. The centerpoint 29 is derived from the slopes of lines 27 and 28 and the midpoints of lines 25 and 26.

In the determination of the centerpoint of a semiconductor wafer, the fact that detected trigger points may fall on a wafer flat must be taken into consideration. Therefore, the centerfinder algorithm of this invention incorporates a strategy such as that shown in Table II to ensure that at least one accurate centerpoint will be determined from six detected trigger points, assuming two points fall on a flat:

TABLE II

| # | Bad | Remaining Points | Points to Determine Center |
|---|-----|------------------|----------------------------|
| 1 | 1, 2 | 3, 4, 5, 6 | 3 + 5, 4 + 6 |
| 2 | 1, 3 | 2, 4, 5, 6 | 2 + 5, 4 + 6 |
| 3 | 1, 4 | 2, 3, 5, 6 | 2 + 6, 3 + 5 |
| 4 | 1, 5 | 2, 3, 4, 6 | 2 + 6, 4 + 6 |
| 5 | 1, 6 | 2, 3, 4, 5 | 2 + 3, 3 + 5 |
| 6 | 2, 3 | 1, 4, 5, 6 | 1 + 4, 5 + 6 |
| 7 | 2, 4 | 1, 3, 5, 6 | 1 + 3, 3 + 6 |
| 8 | 2, 5 | 1, 3, 4, 6 | 1 + 4, 4 + 6 |
| 9 | 2, 6 | 1, 3, 4, 5 | 1 + 3, 3 + 5 |
| 10 | 3, 4 | 1, 2, 5, 6 | 2 + 6, 5 + 6 |
| 11 | 3, 5 | 1, 2, 4, 6 | 2 + 6, 6 + 4 |
| 12 | 3, 6 | 1, 2, 4, 5 | 2 + 5, 4 + 5 |
| 13 | 4, 5 | 1, 2, 3, 6 | 2 + 3, 3 + 6 |
| 14 | 4, 6 | 1, 2, 3, 5 | 1 + 3, 3 + 5 |
| 15 | 5, 6 | 1, 2, 3, 4 | 2 + 3, 3 + 4 |

The first column of Table II is an index showing that from six trigger points detected by a three sensor array, there are fifteen (15) potential combinations of six points (non-repetitive), taken two at a time, that can be used to determine the centerpoint of a wafer under the assumption that at least two points are "bad," i.e., they fall on a wafer flat. The second column represents each combination of two points out of the six trigger points which are assumed to be bad. The third column lists the remaining combinations of four trigger points left to determine the centerpoint of the wafer. The fourth and last column depicts the combinations of two sets of two points used to determine the centerpoint of the wafer as shown in FIG. 5. The combinations of two points having the largest angular separation are preferred to minimize error.

A subroutine is called and the information in the last column of Table II is retrieved for calculation of a "candidate" centerpoint of the wafer for each row #1-15. For each row, the radius to each of the six trigger points is calculated as illustrated in FIG. 4. The radii are then arranged in rank order. The largest four radii are compared and must fall within a designated measurement error. The remaining two radii must either be equal (on circle) or less than equal (on flats) to the largest four. If this comparison test is passed, the "candidate" centerpoint is marked "good" and the centerpoint recorded. If the comparison test is not passed, the candidate centerpoint is marked "bad" and discarded. After all candidate centers are tested, those marked "good" are averaged to return the best estimate for the actual centerpoint of the wafer. If none of the six trigger points fall on a flat, fifteen candidate centerpoints will be averaged. If only one of the six trigger points is on a flat, five or more candidate centerpoints will be averaged. If two of the six trigger points fall on a flat, one or more candidate centerpoints will be averaged. Any fewer than two "bad" points will give a more robust determination of the wafer centerpoint.

There may be a rare instance that a wafer may be so far off-center of the robot blade toward the end of the blade that the sensor closest to the robot center point will detect only the leading and trailing edges of the robot blade, or there may be an input data acquisition error due to noise. In these cases, where the calculated radii are determined to be substantially different than the known radius of the wafer, the trigger points are eliminated. In the alternative, an automatic recovery routine can be executed whereby the centerfinder method is performed by a second array, another backup centerfinder system and/or operator intervention.

b. Centerfinder Routine

The logic flow chart 34 of the centerfinder routine of this invention is shown in FIG. 7. The centerfinder routine begins with standard instructions (35) to command the system transfer robot to pick up a wafer from a wafer chamber. The robot knows the position of the center of the wafer chamber having previously been calibrated by the calibration method of this invention described below.

The next step (36) in the routine is to retract the robot blade and the wafer from the first wafer chamber and rotate the robot blade and wafer across the sensor array en route to the second, destination wafer chamber. The sensors detect the trigger points of the wafer and interrupt input Table I is created (37) by storing the associated step counts. Having determined and stored the corresponding step counts in Table I, the trigger points are next converted (38) to cartesian (X,Y) coordinates using equations:

$$X = r * \sin\theta$$

$$Y = r * \cos\theta.$$

Once the trigger points' cartesian coordinates are calculated, the slopes "m" of the perpendicular bisector lines through pair of points are calculated (39) using the standard equation:

$$m1 = -(x1-x2)/(y1-y2).$$

After the slopes of the perpendicular bisectors are determined, the midpoint coordinates of the lines through pairs of trigger points are determined (40) using the equations:

$$Xm1 = (x1+x2)/2;$$

$$Ym1 = (y1+y2)/2$$

$$Xm2 = (x2+x3)/2;$$

$$Ym2 = (y2+y3)/2$$

Having determined the slopes of the perpendicular bisectors 27 and 28 (FIG. 5) and the midpoints n1 and n2 of the lines through the data points P, the candidate centerpoint (xc,yc) of the wafer is determined by calculating (41) the intersection of the bisector lines 27 and 28 by the following equations:

$$xc = ((m1)Xm1 - Ym1 - (m2)Xm2 + Ym2)/(m1-m2)$$

$$yc = ((m2)Ym1 - m1m2(Xm1) - m1(Ym2) + m1m2(Xm2))/(m2-m1).$$

This calculation of candidate centerpoints continues, repeating steps (39), (40) and (41) until all other point combinations and candidate centerpoints have been calculated.

Once all candidate centerpoints have been calculated, the distances (radii) between the candidate centerpoint and the trigger points are calculated and the largest four radii compared (43) to a predetermined threshold measurement error value ("Δ" e.g., 0.004). (The smallest two of the six radii are not used in the comparison as they are automatically assumed to be on wafer flats.) The radii from each candidate centerpoint to each of the trigger points is calculated using the equation:

$$r_i = \sqrt{(xc - x_i)^2 + (yc - y_i)^2}$$

where i=1, 2, 3, . . . 6 and where $(x_i, y_i)$ are the cartesian coordinates of the detected trigger points. The calculated radii (e.g., $r_1$ to $r_6$) are then arranged in rank order from largest to smallest (e.g., $r_a$, $r_b$, $r_c$, $r_d$, $r_e$, $r_f$ where $r_a$ is the largest and $r_f$ is the smallest). The difference between the largest four is compared to the measurement error threshold $\Delta$ using the equation:

$$r_a - r_d < \Delta$$

If the differential of the largest four radii is determined to be less than the threshold measurement error $\Delta$, the candidate centerpoint is marked "good" and retained (45). If the differential is determined to be larger than the threshold measurement error $\Delta$, the candidate centerpoint is marked "bad" (46) and discarded.

Once all candidate centerpoints have been marked, all "good" centerpoints are averaged (47) to produce the best estimate of the "true" centerpoint of the wafer. Once the averaged best centerpoint is obtained it is stored (4e) for future reference when positioning the wafer for processing. The centerfinder program routine is then complete (49).

3. Robot Calibration

Figure 10:
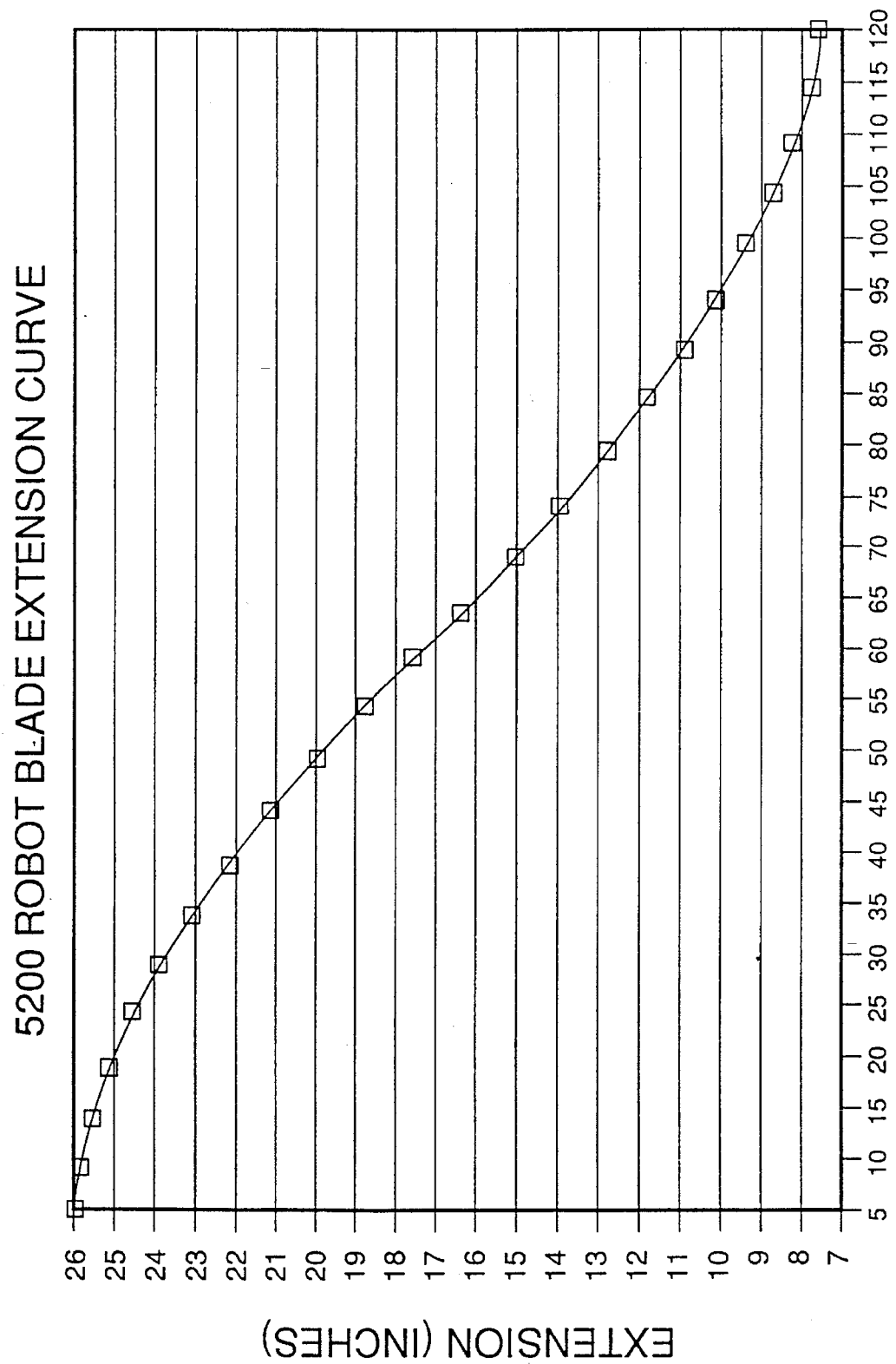
FIG. 10 is a diagrammatic representation of the robot extension equation illustrating the non-linear curve equating extension motor input to extension distance.

The accuracy of the wafer centerfinder method of this invention, and therefore the proper positioning of wafers for processing as described herein above, is dependent upon the proper calibration of the system robot. A reference point of the support blade 4a of the present invention is calibrated in relation to the centerpoint of each process chamber and a determined point along the robot blade extension curve (FIG. 10).

a. Establish Repeatable Reference Point via Robot Home Sequence

To calibrate the support blade 4a in θ, a conventional robot home sequence routine is first executed to determine a repeatable home reference point for the center of the blade 4a. It will be understood that a robot home sequence routine can be readily created and tailored to a particular system, therefore the details of the home sequence routine are not discussed in depth herein. Once the home reference point is determined, it is stored for further use during the calibration and centerfinding methods of this invention as disclosed herein. The home sequence is performed automatically and only once at system power up.

b. Teaching the Robot the Process Chamber Centerpoints

Because the centerpoint of each wafer receiving chamber is a relevant point from which positioning corrections are made, the robot blade must be taught the centerpoint of each chamber.

The robot 4 is taught the centerpoint of each process chamber by positioning the centerpoint orifice 4c of the support blade 4a over a corresponding centerpoint orifice 65a or 65b (FIGS. 3a–3d) of a chamber 3a or 3b. The positioning of the blade orifice 4c is performed manually by keyboard or remote control command. Once the blade center orifice 4c is positioned over the corresponding chamber center location 65a or 65b, a one-eighth inch peg is manually inserted through the robot blade orifice 4c into the corresponding chamber orifice 65a or 65b to verify the correct positioning of the robot blade 4a at the centerpoint of the processing chamber 3a or 3b. When correct positioning is verified, the step values of stepper motors 17a and 17b (FIG. 2) relative to the home sequence reference point are stored in non-volatile memory. This process chamber calibration sequence is repeated for each chamber and the associated step values recorded for further use in positioning the support blade 4a during wafer transfer. It should be noted that the teaching of the process chamber centerpoints need only be performed once upon configuration of the processing system since the positions are stored in non-volatile memory for subsequent use even after system shut down (power off).

c. Determining the Sensor Positions

The calibration of the support blade 4a is determined in relation to the known axis of rotation 4d of the robot center 4b and a determined point of a known radius on the non-linear extension curve (FIG. 10) of the system robot 4. This requires the determination of the location of at least one sensor 6a, 6b, 6c or 6d (FIG. 2), and then using that sensor of known position to calibrate the extension of the robot blade 4a. In the assembly of the system 1 (FIG. 1), the absolute positioning of the sensor beams 6a, 6b, 6c or 6d (FIG. 2), are not critical in the calibration of the robot blade 4a or the performance of the centerfinder method of this invention, as the calibration method can determine the position of each sensor regardless of sensor positioning.

Figure 8:
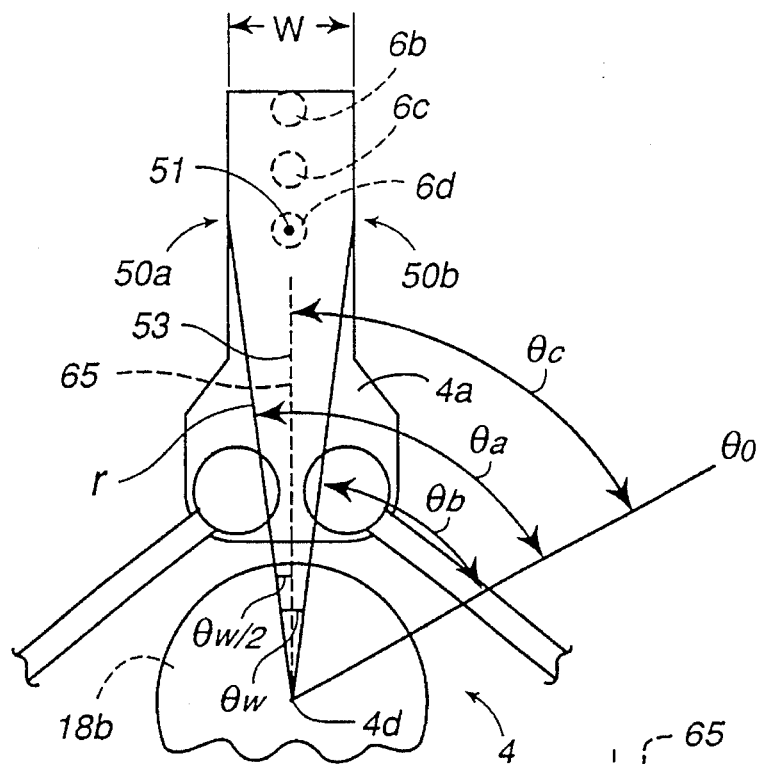
FIG. 8 is a partial plan view of the system robot and support blade in retracted position over the sensor array showing the relationship of the sensor beams to the support blade.

Referring now back to FIG. 8, the positions of the exemplary photoelectric sensors 6d, 6c and 6b are found in terms of polar coordinates "r" and "θ". "R" is the distance of the sensor from the center of robot rotation 4d in inches. $\theta_c$ is the angle of rotation of the support blade 4a from the known home sequence reference line $\theta_0$. By way of example, the $\theta_c$ position of sensor 6d is determined by noting the angles $\theta_a$ and $\theta_b$, where the edges 50a and 50b of support blade 4a break the beam 33. The relative path 52 of the sensor 6d across the support blade 4a is as illustrated. The middle point 51 between the two intercepts 50a and 50h corresponds to the angle $8_c$ locating the sensor 6d. The robot support blade centerline 53 is shown aligned so that it is on a radial line from the center of rotation 4d of the robot 4. Thus, the location $\theta_c$ (the angle from the robot home position $\theta_0$) of the sensor 6d is determined by summing the number of rotation steps to the detector intercept of each edge 50a and 50h from the robot home position $\theta_0$ BS dividing by two. By this procedure, the angular position of each of the sensors can be determined.

To determine the radial distance "r" of a sensor from the center of robot rotation 4d, where the width "W" of the robot blade is a known system constant and having determined Theta, the following calculation is performed:

$$r = w/2 * \sin(\theta_w/2)$$

where $\theta_w$ is that angle shown in FIG. 8.

Once the radial distances "r" are determined and combined with the corresponding angles $\theta_c$, the exact location of each sensor is known. Calibration values of the sensor positions are then stored in non-volatile memory. In practice, it has been found that by approaching the sensor from both sides and taking the middle point as the actual sensor position, sensor hysteresis can be removed.

d. Correlating the Robot Blade Position to the Robot Extension Curve

Figure 9:
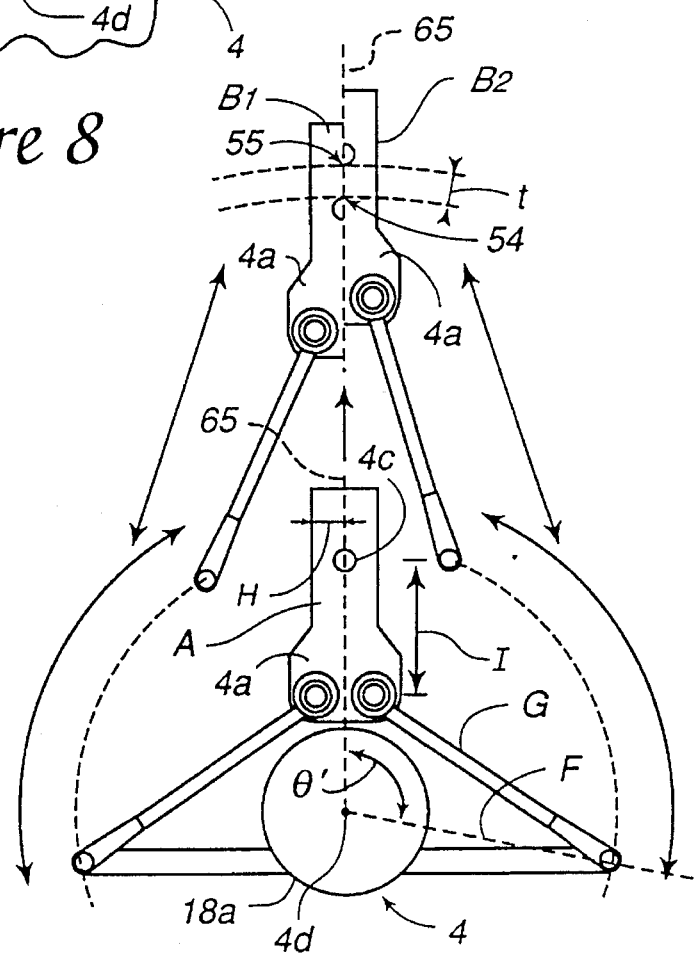
FIG. 9 is a sequential plan view of the system robot including a transfer blade showing the movement of the blade from a retracted position to an extended position (split view) over a selected sensor required for the calibration of the robot blade of this invention.

Referring now to FIGS. 9 and 10, the robot blade 4a is calibrated in R in relation to the known center of rotation 4d of the robot. This is accomplished by correlating the support blade 4a in its retracted position as shown at A in FIG. 9 to one point of a known radius on the nonlinear extension curve of the robot 4 as shown in FIG. 10.

There is preferably located on the support blade 4a a one-eighth inch diameter orifice 4c disposed in a "center" position intended to be concentric with the centerpoint of a wafer 5 when the wafer 5 is exactly centered on the support blade 4a. The location of the support blade 4a is determined by first rotating the robot 4 so that the centerline of the blade (the longitudinal axis) is located at the angular coordinate of a selected sensor (see FIG. 9). The support blade 4a is then radially extended to positions $B_1$ and $B_2$ from its retracted position A such that the leading and trailing edges 54 and 55 (trigger points) of the centerpoint hole 4c are detected, the radial extension being exaggerated t in FIG. 9 for clarity. The relative step counts from the robot home position A to the trigger points 54 and 55 are recorded. The average of the step counts to these two points locates the center of the orifice 4c (and thus the "center" of the blade 4a) and is stored in nonvolatile memory.

By determining the required number of steps it takes to place the robot blade centerpoint orifice 4c at a radial distance of the selected sensor, one corollary point on the robot extension curve (FIG. 10) can be determined. For example, by plugging into the nonlinear robot extension equation (FIG. 10) the radial distance in inches of the selected sensor, we can determine the angular rotation of the stepper motor 17a (FIG. 2) required to move the support blade 4a from its retracted position to a position with its center point aligned with the radial line of a sensor. Because it is known that there are 200,000 steps for a full rotation ($2\pi$ radians) of the robot 4, the extension or retraction from the radial line of the selected sensor to any selected point can be calculated using the robot extension equation. When this information is combined with the wafer centerfinder system and method disclosed hereinabove, a wafer 5 can be precisely positioned at any selected point.

c. Calibration Routine

The flow chart of the calibration routine 56 of this invention is shown in FIG. 11. The calibration routine begins with standard instructions (57) to drive motors 17a and 17b (FIG. 2) of the robot 4 from its home, blade retracted position and to rotate the device to a position such that the wafer support blade 4a passes through the beam of a selected sensor 57 for detection of the edges (points 50a and 50b as shown in FIG. 8) of each parallel side of the blade.

The routine then records (58) the motor step values at which the selected sensor detects the leading and trailing edge points 50a and 50b of the blade 4a. The recorded step values are then averaged (59) to determine the angle $\theta_c$ (FIG. 8) through which the robot must rotate to center the blade axis 65 (FIG. 9) at the sensor. This $\theta_c$ value is then stored.

The radius of the selected sensor is then calculated (60) using the determined $\theta c$ (angle from the robot home position $\theta_0$) and the known blade width W using the following equation:

$$r = w/(2\sin(\theta c/2))$$

where:

$\theta_c = 360((\#steps\ leading\ edge) - (\#steps\ trailing\ edge))/200,000$; and w=known blade width (a constant) in inches.

To determine the corollary position coordinates of the center point 4c of the support blade 4a to a position along the robot extension curve (FIG. 10), instructions (61) are next provided to rotate robot 4 such that the centerline 65 of robot blade 4a is aligned with the angular position of the selected sensor. The support blade 4a is then extended (62) such that the blade orifice 4c passes through the selected sensor beam. The sensor detects the leading and trailing edges 54 and 55 (FIG. 9) of the centerpoint orifice 4c, and the relative step values are then averaged and the averaged value stored (63) in non-volatile memory.

The associated theta on the robot extension curve corresponding to the average step value of the centerpoint of the blade orifice 4c is then calculated using the robot equation:

$$\theta = \tan^{-1}\frac{H}{(L-I)} + \cos^{-1}\left[\frac{G^2 - F^2 - H^2 - (L-I)^2}{-2F\sqrt{H^2 + (L-I)^2}}\right]$$

where:

F and G=the robot leg dimension constants as shown in FIG. 9;

H and I=the robot blade dimension constants as shown in FIG. 9; and $$L = I - F\cos(180 - \theta) + \sqrt{G^2 - [(F\sin[180-\theta]) - 1]^2}$$

where

L=the radial distance of the selected sensor in inches from the center of rotation of the robot 4d.

Knowing the corresponding $\theta$, the calibration process is complete, i.e., a calibration reference point is determined on the non-linear robot extension curve FIG. 10 from which all movements of the robot blade can be computed using the robot extension equations. It should be noted that the calibration routine need be performed only once after system configuration and initial power up as the calibration reference point is stored in nonvolatile memory.

While the invention has been particularly shown and described with reference to certain preferred embodiments, it will be understood by those skilled in the art that various alterations and modifications in form and in detail may be made therein without departure from the spirit and scope of the invention. Accordingly, it is intended that the following claims cover all such alterations and modifications as may fall within the true spirit and scope of the invention.

What is claimed is:

1. A system for accurately positioning an object at a preselected location comprising:

a) object transfer means including a moveable support for carrying said object along a predetermined arcuate path between a first location and the preselected location, the position of said moveable support being known at all times;

b) an array of sensors, at least two of which are disposed along an axis generally transverse to said arcuate path, said sensors being operative to detect a plurality of positions on the perimeter of the object as it is carried by the moveable support along said arcuate path and moved therethrough, to generate signals from which the position of said object relative to the signals from which the position of said object relative to the known position of said moveable support can be determined;

c) detecting means to determine the relative position of the centerpoint of said object and the centerpoint of said object support; and d) moving means responsive to the signals and operative to position the object support so that the centerpoint of the object is moved to said preselected position.

2. In an object processing apparatus having a central transfer chamber; a plurality of peripheral chambers positioned around the periphery of said central transfer chamber; a moveable object transfer means disposed in said transfer chamber and having an object support for loading, moving and unloading objects having a leading and a trailing edge to and from said peripheral chambers, which object support is moved within said central transfer chamber generally along an arcuate path between said peripheral chambers; the improvement which comprises:

position control means for detecting the position of the object relative to said support and causing said transfer means to accurately position the object in one of said peripheral chambers, comprising:
  a) means for providing object support reference signals indicative of the position of an object support reference point;
  b) a sensor array including at least two sensors mounted along an axis generally transverse to the arcuate path, said sensors being triggered by the leading and trailing edges of the moving object as it passes therethrough and developing corresponding object position signals from which an object position reference point can be determined; and
  c) means responsive to the object support reference signals and the object position signals and operative to calculate the location of the object position relative to the object support, and further operative to move said object support to a corresponding offset position relative to said preselected location so as to position said object at said preselected location in one of the peripheral chambers.

3. An improved position control means as in claim 2, wherein the object comprises a generally circular semiconductor wafer, the centerpoint of which is concentric with said object support centerpoint when said wafer is perfectly positioned on said object support.

4. An improved position control means as in claim 2, wherein the means responsive to said object position signals and said object support signals includes a computer system programmed to control the transfer of said wafers from chamber to chamber.

5. An improved position control means as in claim 4, wherein said means providing object support reference signals includes a memory prerecorded to contain said object support reference signals.

6. An improved position control means as in claim 5, wherein said prerecorded object support reference signals are obtained by driving said object support from a home position to a position in alignment with one of said sensors and using the corresponding drive information to calculate said object support reference signals.

7. An improved position control means as in claim 2, wherein said object support includes an elongated blade having an attribute detectible by said sensors.

8. An improved position control means as in claim 7, wherein the detectible attribute of the object support comprises a centrally disposed orifice provided in said blade having edges detectible by said sensors.

9. An improved position control means as in claim 7, wherein said preselected location identifies a wafer position in one of the peripheral chambers.

10. An improved position control means as in claim 4, wherein the computer system includes:
  control logic means operative to determine the wafer and object support reference points and to calculate the relative location of said wafer to said object support;
  means for controlling the movements of the object support; and
  means for interfacing the logic control means and the sensor array.

11. In an object processing apparatus having a central transfer chamber; a plurality of peripheral chambers positioned around the periphery of said central transfer chamber; a moveable object transfer means disposed in said transfer chamber and having an object support for loading, moving and unloading objects having a leading and a trailing edge to and from said peripheral chambers, which object support is moved within said central transfer chamber generally along an arcuate path between said peripheral chambers; the improvement which comprises:
  position control means for detecting the position of the object relative to said support and causing said transfer means to accurately position the object in one of said peripheral chambers, comprising:
  a) means for providing object support reference signals indicative of the position of an object support reference point;
  b) a sensor array including at least two sensors mounted along an axis generally transverse to the arcuate path, said sensors being triggered by the leading and trailing edges of the moving object as it passes therethrough and developing corresponding object position signals from which an object position reference point can be determined; and
  c) means responsive to the object support reference signals and the object position signals and operative to calculate the location of the object position relative to the object support, and further operative to move said object support to a corresponding offset position relative to said preselected location so as to position said object at said preselected location in one of the peripheral chambers; wherein the means responsive to said object position signals and said object support signals includes a computer system programmed to control the transfer of said wafers from chamber to chamber, and wherein said computer system includes:
  control logic means operative to determine the wafer and object support reference points and to calculate the relative location of said wafer to said object support;
  means for controlling the movements of the object support' and
  means for interfacing the logic control means and the sensor array.

12. A method for accurately positioning an object having a centerpoint on a moveable object support, the position of the object support being known at all times, from a first location to a preselected second location, the position of said moveable object support at all times being known, and the position of said object relative to said moveable object support initially being unknown, comprising the steps of:
  rotating the object support about its axis from the first position to a second position past an array of sensors mounted generally transverse to the arcuate path;
  detecting perimeter points along the perimeter of the object as the moveable object support is moved along the arcuate path, thereby triggering the sensors to generate object signals from which the position of the centerpoint of said object can be determined relative to the known centerpoint position of said moveable object support;
  determining any position error between the centerpoints of the object support and the object; and
  moving said moveable object support and said object supported thereon so that said centerpoint of said object is coincident with said second selected location.

13. A method as in claim 12, wherein the step of determining the object position comprises the steps of:
  a) determining at least three polar coordinate points of the object from the known position of the moveable object support and the object position signals;
  b) converting said polar coordinate points to cartesian coordinate points;

c) calculating the slopes of imaginary perpendicular bisector lines to imaginary lines joining at least two pairs of the cartesian coordinate points;

d) calculating the midpoints of the imaginary lines joining said pairs of said cartesian coordinate points;

e) calculating the points of intersection of the perpendicular bisector lines from the calculated slopes and midpoints;

f) repeating the steps c), d) and e) for all pairs of said cartesian coordinate points;

g) comparing the calculated points of intersection to a specified numerical range; and h) calculating the average of the points of intersection falling within the specified numerical range.

14. A method for determining the position of a moveable object support having a known width, a detectable centerpoint and a home reference position relative to a known location in a processing system, said moveable support being disposed within a transfer chamber having a plurality of chambers positioned around the periphery of said transfer chamber and moveable between said processing chambers along a generally arcuate path intersecting a radial axis, comprising the steps of:

rotating said object support along said arcuate path past one or more sensors disposed at one or more points along said radial axis in said central transfer chamber thereby generating sensor signals;

detecting the position of at least one of said sensors for generating sensor position signals;

detecting the position of the moveable object support for generating object support position signals; and calculating the position of the object support relative to the known location from said sensor position signals and object support position signals.

15. A method as in claim 14, wherein the step of detecting the position of at least one of said sensors comprises the steps of:

detecting a leading and trailing edge of the moveable object support by moving said moveable object support along the arcuate path, thereby triggering the sensor to generate signals representing point positions of said detected leading and trailing edge;

recording said point positions in terms of values;

calculating the average of said values operative to give a rotational angle of said sensor position; and calculating the radius of the sensor position from the calculated rotational angle and the known width of the moveable object support.

16. A method as in claim 15, wherein the step of detecting the position of the moveable object support comprises the steps of:

rotating the moveable object support so that the position of said moveable object support is concurrent with the radial axis of the sensor position;

extending the moveable object support along the radial axis of the sensor causing said sensor to detect a leading and trailing edge of said detectible centerpoint of said moveable object support and operative to generate associated position signals;

recording said position signals in terms of values; and calculating a point along said arcuate path of said support equal to said values as a relative positioning value for moving said object support relative to said selected location.

17. A method for accurately positioning an object at a preselected location comprising:

a) detecting the relative position of the object with respect to a moveable object support upon which said object is supported, said object support moveable along an arcuate path between a first location and said preselected location, the position of said moveable object support and said object relative to said moveable object support initially being unknown, comprising the steps of:

b) rotating the object support about its axis from the first position to a second position along an arcuate path past an array of at least two sensors mounted along an axis generally transverse to the arcuate path;

c) detecting the position of a sensor for generating sensor signals;

d) detecting the position of the moveable object support;

e) calculating the relative position of the moveable object support with respect to the preselected location from said sensor signals and object support signals;

f) detecting perimeter points along the perimeter of the object as the moveable object support is moved along the arcuate path, thereby triggering the sensors to generate object signals from which an object position point can be determined relative to said moveable object support, g) calculating the object position point relative to the position of the moveable object support from the object signals and the object support signals, and h) moving said moveable object support and said object supported thereon to the preselected location so that the object position point of said object is coincident with said preselected location.

18. In an object processing apparatus having a central transfer chamber and a plurality of peripheral chambers positioned about the periphery of said central transfer chamber; a moveable object transfer means disposed in said transfer chamber and having an object support for loading, moving and unloading objects having a leading and a trailing edge to and from said peripheral chambers, which object support is moved within said central transfer chamber generally along an arcuate path between said peripheral chambers; the improvement which comprises position control means for detecting the position of the object relative to said support and causing said transfer means to accurately position the object in one of said peripheral chambers, said position control means comprising:

a) a prerecorded memory containing object support reference signals indicative of the position of a reference point on the object support;

b) a sensor array including at least two sensors mounted along an axis generally transverse to said arcuate path, said sensors being triggered by the leading and trailing edges of the moving object as it passes therethrough and developing corresponding object position signals from which a reference point on the object can be determined;

c) computer means responsive to the object support position signals and the object position signals operative to calculate the location of the reference point on the object support with respect to the location of the reference point on the object;

d) motor means operative to move said object support to an offset position relative to said preselected location so as to position said object reference point at said preselected location in one of the peripheral chambers.

* * * * *